United States Patent
Bicksler

(10) Patent No.: US 8,243,522 B2
(45) Date of Patent: Aug. 14, 2012

(54) NAND MEMORY PROGRAMMING METHOD USING DOUBLE VINHIBIT RAMP FOR IMPROVED PROGRAM DISTURB

(75) Inventor: Andrew Bicksler, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 244 days.

(21) Appl. No.: 12/647,298

(22) Filed: Dec. 24, 2009

(65) Prior Publication Data

US 2011/0157995 A1 Jun. 30, 2011

(51) Int. Cl.
*G11C 11/34* (2006.01)
(52) U.S. Cl. .................................. 365/185.19
(58) Field of Classification Search ............... 365/185.19
See application file for complete search history.

(56) References Cited

U.S. PATENT DOCUMENTS

2002/0118569 A1* 8/2002 Jeong et al. ............... 365/185.18
2007/0297226 A1* 12/2007 Mokhlesi ................... 365/185.2

* cited by examiner

*Primary Examiner* — Hoai V Ho
*Assistant Examiner* — Anthan Tran
(74) *Attorney, Agent, or Firm* — Cool Patent, P.C.; Joseph P. Curtin

(57) ABSTRACT

A method of applying an inhibit bias to an unselected word line when programming a NAND memory device is provided. The method may include ramping the inhibit bias to the unselected word line to a first predetermined voltage and ramping the inhibit bias to the unselected word line to a second predetermined voltage. Ramping of the inhibit bias to the unselected word line to a first predetermined voltage may occur until a boosted channel reaches a leakage limited saturation potential.

16 Claims, 5 Drawing Sheets

NAND MEMORY PROGRAMMING METHOD USING DOUBLE VINHIBIT RAMP FOR IMPROVED PROGRAM DISTURB

BACKGROUND

Flash memory commonly uses Fowler-Nordheim tunneling for programming memory cells. The tunneling current is dependent on the voltage gap between a control gate and a channel region. When programming memory cells, a program voltage is applied to a word line containing memory cells being programmed and other cells which are to be inhibited from programming. Program disturb occurs when programming of memory cells causes an inhibited memory cell on the same word line to become inadvertently programmed.

Program disturb is expected to be a key limiter of NAND memory cell scaling. As the size of memory is scaled down, the natural variation in the cell to cell programming behavior increases. As a result, it becomes harder and harder to keep a fast programming cell which is in an erased state from disturbing up while ensuring that a slow programming cell can program to a target threshold voltage Vt.

During programming, unselected word lines are supplied a voltage to inhibit the memory cells on the unselected word line so that the memory cells are not programmed. The voltage goes into the channel region, which is boosted from coupling with the inhibited word lines and improves program disturb. Voltage, however, leaks out of the channel region.

BRIEF DESCRIPTION OF THE DRAWINGS

The claimed subject matter will be understood more fully from the detailed description given below and from the accompanying drawings of disclosed embodiments which, however, should not be taken to limit the claimed subject matter to the specific embodiment(s) described, but are for explanation and understanding only.

DETAILED DESCRIPTION

Figure 1:
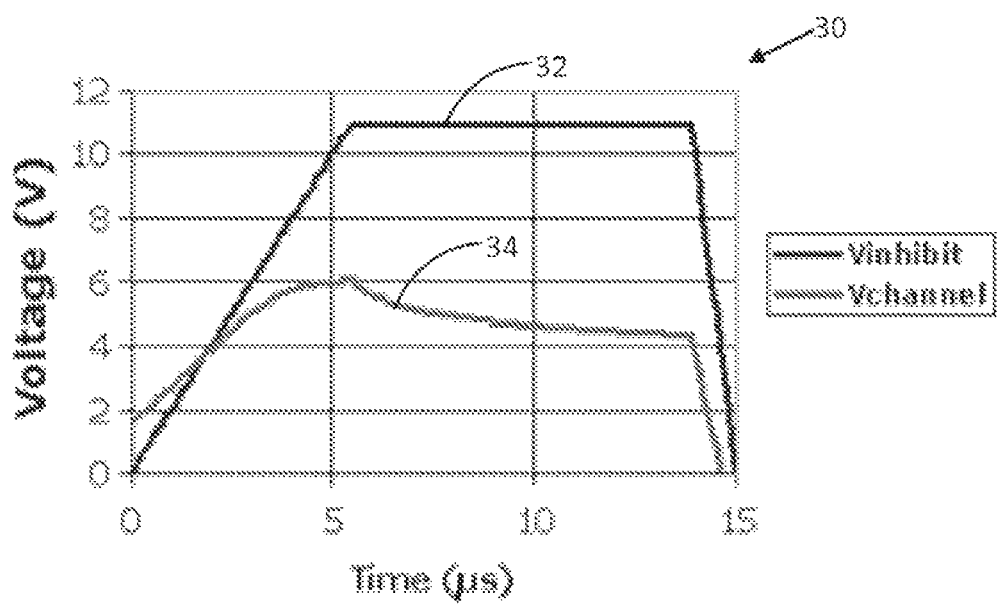
FIG. 1 is a diagram showing a conventional unselected word line bias (Vinhibit) and the resulting channel potential (Vchannel).

Referring to FIG. 1, a diagram showing a conventional unselected word line bias (Vinhibit) and the resulting channel potential (Vchannel) is shown at 30. A conventional program waveform 32 for an inhibit bias is a ramped pulse with a flat top. As shown in FIG. 1, during a ramped portion, the channel voltage (Vchannel) 34 is boosted due to coupling with unselected word lines of a memory device, as further described in FIG. 10 below. Vchannel may also be referred to as "Vboost" or "boosted channel potential". During the flat portion of the pulse, Vchannel decays due to leakage currents. As non-limiting examples, leakage currents may include gate-induced drain leakage (GIDL), junction leakage, field isolation leakage, etc.

Figure 2:
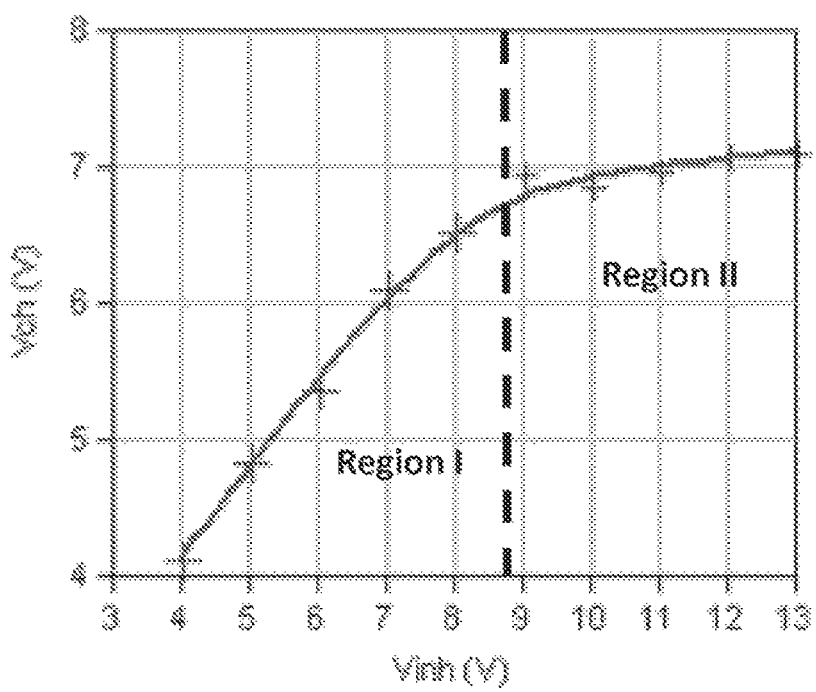
FIG. 2 is a diagram graphing measured boosted channel potential (Vch) versus unselected word line bias (Vinh) for a conventional Vinhibit pulse.

FIG. 2 shows a diagram graphing measured boosted channel potential (Vch) versus unselected word line bias (Vinh) for a conventional Vinhibit pulse. A bivariate fit of Vch by Vinh shows two regions: Region I in which Vch and Vinh are dependent, and Region II in which Vch and Vinh are independent. In Region I, Vch may be generalized to equal kbr times Vinh (kbr×Vinh) in which kbr is a boost ratio. When Vinh increases, Vch increases as well. In Region II, Vch may be equal to Vchsat in which Vch is mostly independent of Vinh due to leakage. When Vinh is in Region II, Vch has entered leakage-limited saturation, in which additional Vinh applied is wasted and does not result in additional boosting performance. As shown according to one embodiment, applying Vinh greater than about 8.8 V is ineffective in boosting and/or maintaining Vch.

Figure 3:
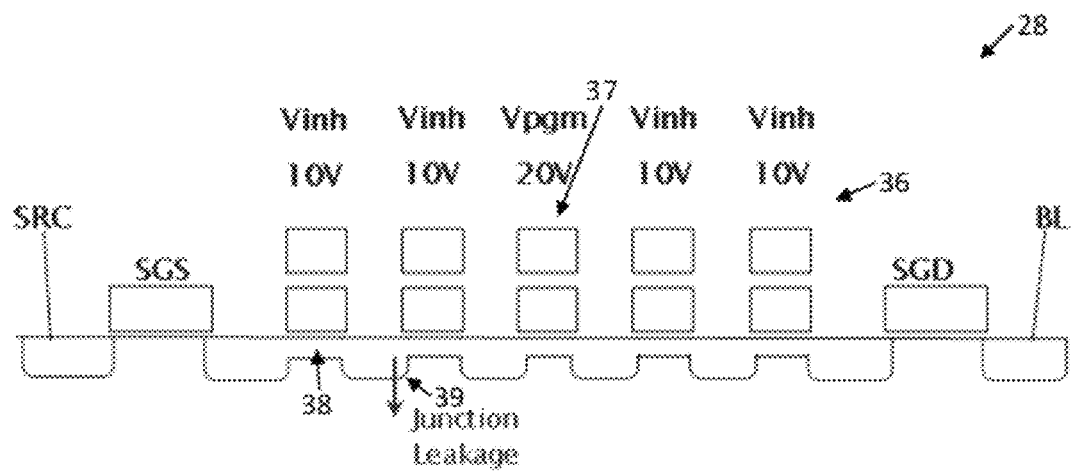
FIG. 3 shows a cross-sectional view of a NAND memory string according to one embodiment.
Figure 10:
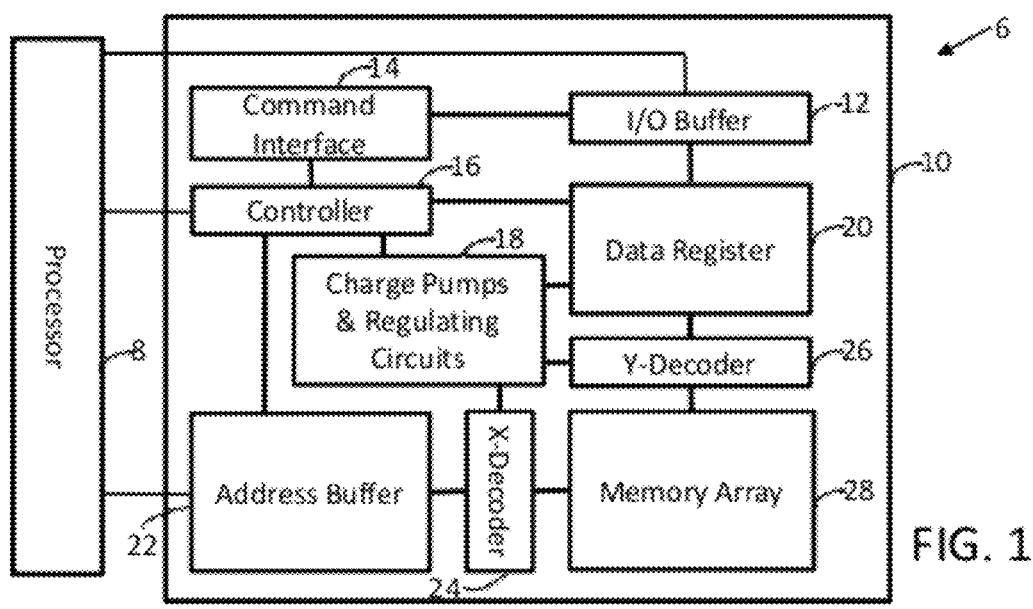
FIG. 10 is a block diagram of an electronic system according to one embodiment.

Referring to FIG. 3, a cross-sectional view of a portion of memory array 28, as further described in FIG. 10, is provided for illustrative purposes. The cross-section is taken along a y-direction, or in other words along a bitline. Memory array 28 may include a NAND memory string 36 of memory cells coupled between select gates SGS and SGD. Select gate SGS may be coupled to a source SRC and select gate SGD may be coupled to a bitline BL.

As shown, the memory string 36 includes 5 memory cells in series, one of which is being programmed at 37, and the rest of which are being inhibited from being programmed. Voltages Vinh and Vpgm may be applied to one or more memory cells during programming. In one example, a program voltage Vpgm (for example, 20 V) is applied to memory cell 37 while an unselected word line bias Vinh (for example, 10 V) is applied to the rest of the memory cells. The voltage Vinh enters a channel region 38 and boosts the voltage in the channel region (boosted channel) 38, in other words, increases Vchannel. In one example, leakage from the channel region 38 may occur at a junction leakage at 39. Memory array 28 may further include other memory cells and/or components and is not limited to what is shown in FIG. 3.

In general, "unselected" may be used to describe a word line in memory array 28 in which one or more memory cells are not being programmed at that instance. If a memory cell is not selected for programming, the memory cell is considered to be on an unselected word line. An inhibit bias may be applied to the unselected word line to prevent the memory cell from being inadvertently programmed, or in other words, the memory cell is to be inhibited from being programmed. If the memory cell is at another point in time when the memory cell is selected to be programmed, then the memory cell is on a selected word line and an inhibit bias is not applied to the selected word line and instead a program voltage is applied.

Figure 4:
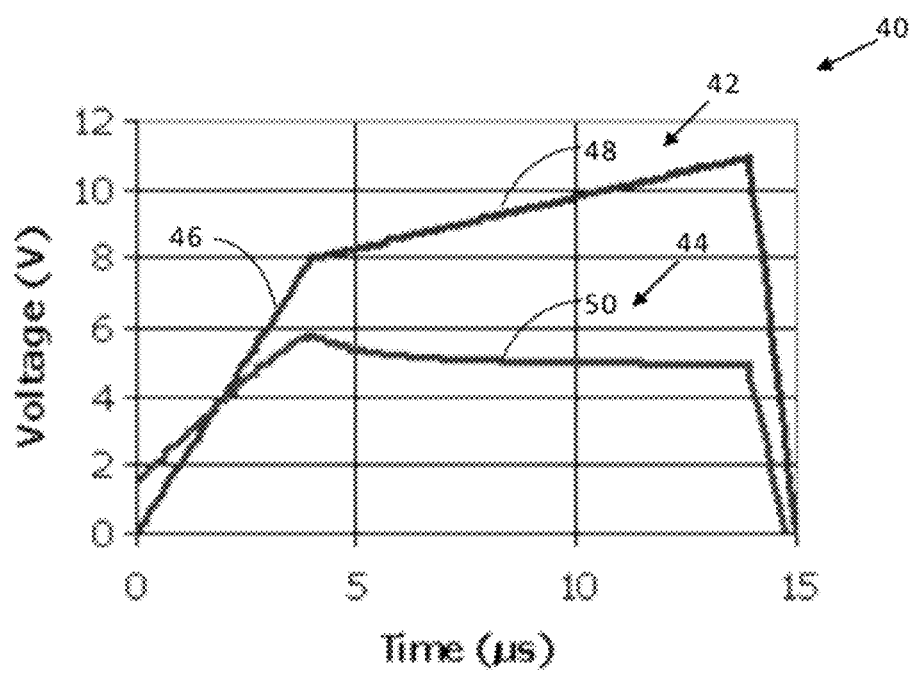
FIG. 4 is a diagram showing an unselected word line bias (Vinhibit) and the resulting channel potential (Vchannel) according to one embodiment.

Referring to FIG. 4, a diagram 40 shows an inhibit bias to an unselected word line (Vinhibit) 42 and the resulting channel potential (Vchannel) 44 according to one embodiment. Vinhibit 42 may include a first ramp 46 capable of boosting Vchannel to a first predetermined voltage and a second ramp 48 capable of boosting Vchannel to a second predetermined voltage. The second ramp 48 may be used to help counter the channel potential decay caused by leakage currents. The first ramp 46 and the second ramp 48 may be referred to as "double Vinhibit ramps", or "dual ramps". As shown at 50, Vchannel 44 may have less leakage as compared to conventional Vchannel, further illustrated in FIG. 6.

In one embodiment, the first predetermined voltage may be at or near a voltage in which a boosted channel reaches a leakage-limited saturation potential which may occur when a channel potential in the channel region has little or no dependency on the bias that is applied, herein referred to as "Vinhibit at saturation". Vinhibit at saturation may be determined empirically such as, for example, by measuring data and applying a bivariate fit to the data such as shown in FIG. 2 above. In one embodiment, Vinhibit at saturation may be measured when memory devices are tested and the first predetermined voltage may be adjusted individually and preset for each memory device. In one embodiment, Vinhibit at saturation may be measured in an initial sample during manufacturing and applied to the other memory devices during a manufacture process.

The first predetermined voltage and/or the second predetermined voltage may be preset and based on other factors as well. For example, factors such as composition of substrate underneath the channel region, differences in processing, temperature, amount of leakage from the channel region, etc. may be taken into consideration for determining the first predetermined voltage and/or the second predetermined voltage.

In one embodiment, the first predetermined voltage may range from about 4 V to about 8 V. In one embodiment, the first predetermined voltage may be at or approximate the same value as the flat top of the pulse of the conventional Vinhibit waveform. In one embodiment, the second predetermined voltage may range from about 9 V to 13 V. In one or more embodiments, the ranges in voltages may vary and may not be limited in these respects.

Figure 5:
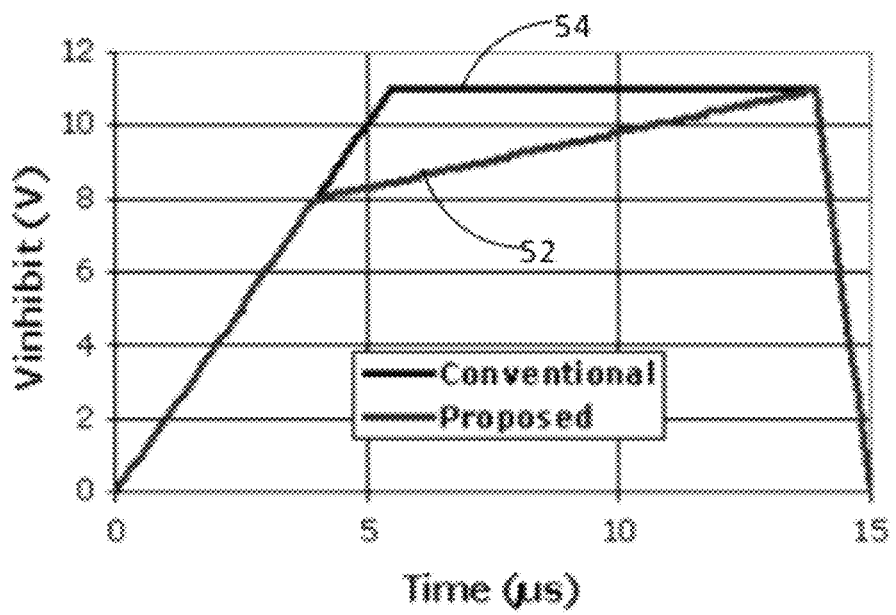
FIG. 5 is a diagram graphing Vinhibit of FIG. 4 versus a conventional Vinhibit pulse.

FIG. 5 is a diagram graphing Vinhibit of FIG. 4 versus a conventional Vinhibit pulse. Shown as 52, Vinhibit of FIG. 4 may include a first ramp to a first predetermined voltage and a second ramp to a second predetermined voltage. In one embodiment, the first predetermined voltage is set to or about 8 V, and the first ramp may have the same slope as the conventional Vinhibit pulse 54. The second ramp is, however, applied after the first predetermined voltage is reached. In one embodiment, the second predetermined voltage may be equal to the maximum Vinhibit of the conventional Vinhibit pulse 54, however, the second predetermined voltage is not limited in this respect. It should be noted that in accordance with one embodiment, Vinhibit of FIG. 4 may be split into different ramps, for example, some with different slopes and peak voltages, and not only limited to those shown in the figures.

Figure 6:
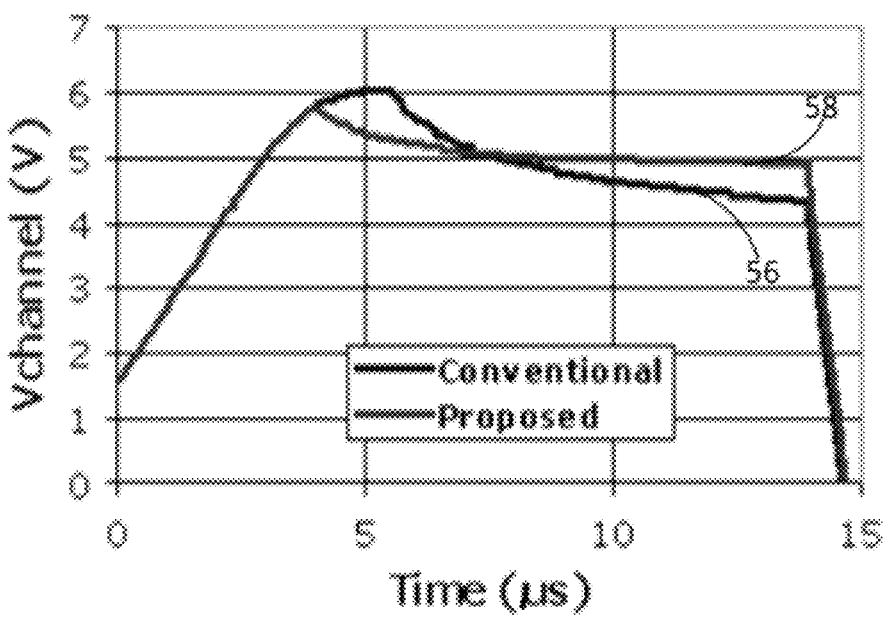
FIG. 6 is a diagram graphing Vchannel of FIG. 4 versus conventional Vchannel.

FIG. 6 is a diagram graphing Vchannel of FIG. 4 versus conventional Vchannel. In the conventional Vchannel, the leakage currents cause Vchannel to decay as shown at 56. The second ramp to the second predetermined voltage may effectively reduce the Vchannel decay as shown at 58. In one embodiment, the second predetermined voltage may counter at least a portion of leakage which is pulling Vchannel down.

Figure 7:
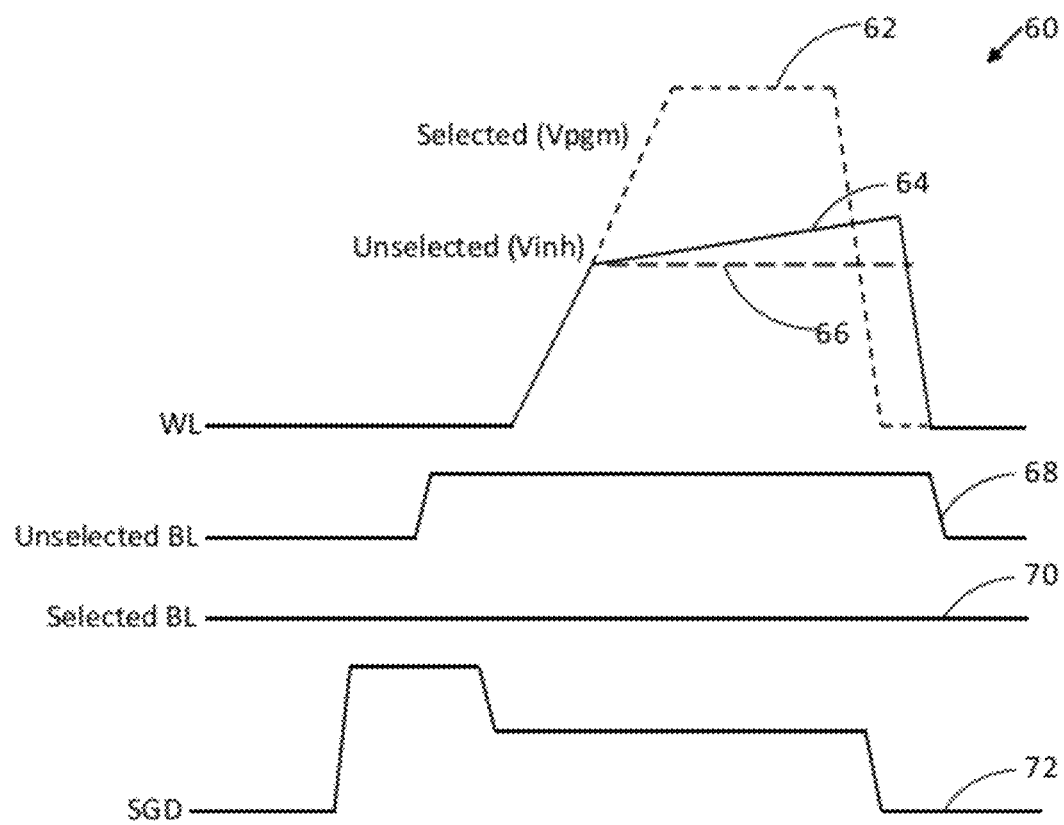
FIG. 7 is a timing diagram during programming according to one embodiment.

FIG. 7 is a timing diagram 60 during programming according to one embodiment. Timing diagram 60 may include a program voltage Vpgm 62 to be applied to one or more word lines with memory cells to be programmed. In one embodiment, a waveform 64 with dual ramps is compared with a conventional unselected word line bias waveform 66. In one embodiment, the second predetermined voltage is higher than a conventional Vinhibit. Timing diagram 60 further includes unselected bitline 68, selected bitline 70, and SGD 72 values during programming.

Figure 8:
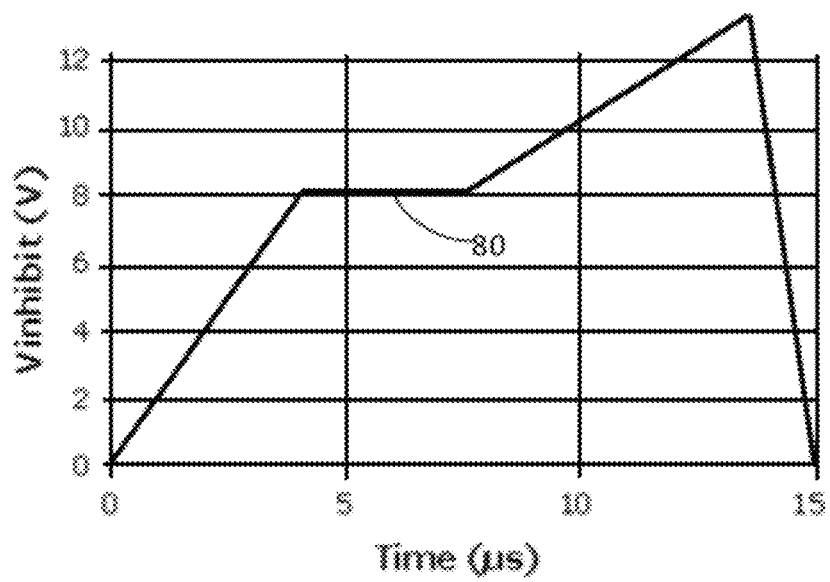
FIG. 8 is a diagram showing Vinhibit according to one embodiment.

FIG. 8 is a diagram showing Vinhibit according to one embodiment. Vinhibit may include 2 ramps to 2 different predetermined voltages, respectively, and in between the ramps, there may be a brief holding period. After reaching a first predetermined voltage, there may be a predetermined period of time (wait time) of greater than 0 microseconds to less than 5 microseconds, but the claim subject matter is not limited in this respect. The first predetermined voltage may be held until a second ramp to a second predetermined voltage begins. In one embodiment, there may be a voltage savings.

Figure 9:
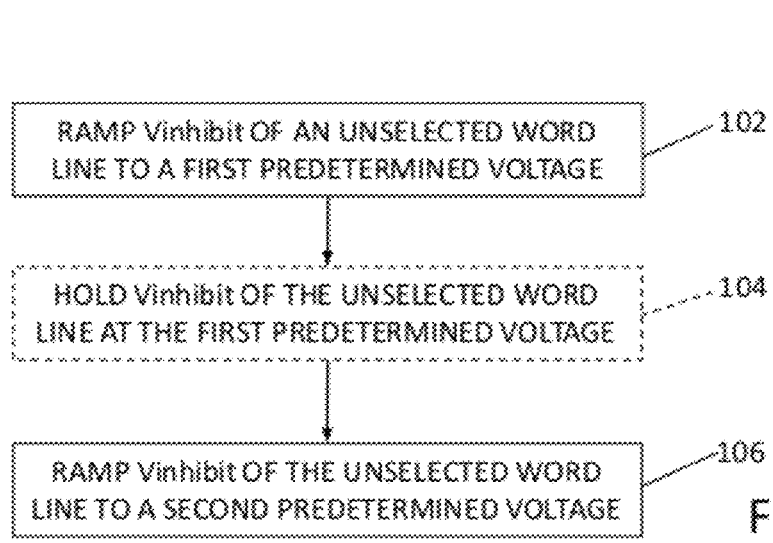
FIG. 9 is a flowchart showing a method according one or more embodiments.

FIG. 9 is a flowchart showing a method 100 according one or more embodiments. Method 100 may include, at 102, ramping Vinhibit of an unselected word line to a first predetermined voltage. In one embodiment, as shown in 104, method 100 may include optionally holding Vinhibit of the unselected word line at the first predetermined voltage. In one embodiment, at 106, method 100 may include ramping Vinhibit of the unselected word line to a second predetermined voltage. Method 100 may also be referred to as a dual ramp method 100.

Referring to FIG. 10, an electronic system according to one embodiment is shown at 6. Electronic system 6 may include a memory device 10 and a processor 8 in communication with memory device 10. Processor 8 may be a microprocessor or some other type of controlling circuitry, and may be capable of performing mathematical operations, moving data from one memory location to another, and/or make decisions and jump to follow new instructions. In one embodiment, electronic system 6 may include a medium having machine-readable instructions stored thereon for execution by a processor, that if executed by the processor, the machine-readable instructions cause the processor to perform one or more methods and/or algorithms disclosed above. Electronic system 6 is simplified as shown, but it should be understood electronic system 6 may include additional components.

In one or more embodiments, memory device 10 may also be programmed with one or more methods and/or algorithms disclosed above. The memory device 10 may be further programmed with data, read to retrieve data, and erased to clear the memory device. Memory device 10 includes an input/output (I/O) buffer 12, a command interface 14, a controller 16, charge pumps and regulating circuits 18, a data register 20, an address buffer 22, x-decoder 24, y-decoder 26, and a memory array 28. Other embodiments of the memory device may include other components or omit some of those illustrated in FIG. 10.

The I/O buffer 12 may be configured to receive input and output and act as an external interface. The I/O buffer 12 may hold inputted commands for controlling the memory device 10, address information, data to be entered into the memory array 28, and data retrieved from the memory array 28. The I/O buffer 12 may then send data to other components in the memory device 10. Commands are sent to the command interface 14. The command interface 14 receives and recognizes user input commands and directions. The command interface 14 further activates the controller 16.

The controller 16 is responsible for running the other components of the memory device 10 for programming and erasing of the memory array 28. The controller 16 may include a state machine for dedicated reading, erasing, and programming operations using operation code.

The controller 16 communicates with the charge pumps and regulating circuits 18 to provide bias voltages and sustain dynamic or static loads during different operating conditions to the memory array 28. Other regulating circuits 18 may include clocking circuits, and other peripheral circuits for operating the memory device 10. The charge pumps and other regulating circuits 18 also provide voltages to the data register 20, the x-decoder 24, the y-decoder 26, and other memory components that may require regulated voltages.

Figure 11:
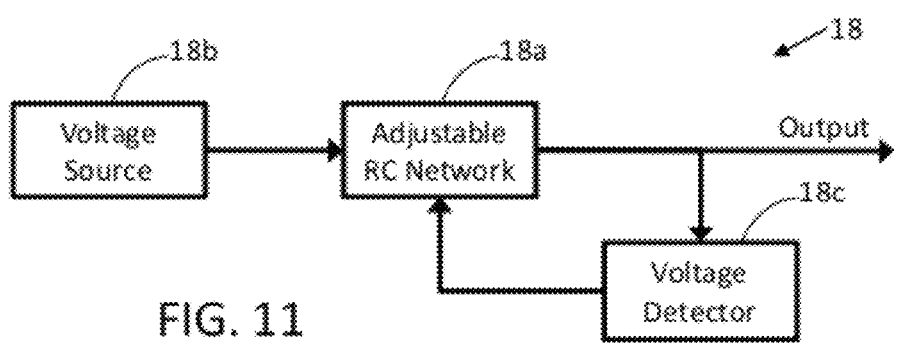
FIG. 11 is a block diagram of charge pumps and regulating circuit of FIG. 10 according to one embodiment.

Referring briefly to FIG. 11, charge pumps and regulating circuits 18 may include an adjustable RC network 18a, a voltage source 18b, and a voltage detector 18c for regulating Vinhibit according to one embodiment. Voltage source 18b provides voltage to adjustable RC network 18a. Adjustable RC network 18a may be preset to output a first predetermined voltage to generate a first ramp. Once voltage detector 18c detects a preset condition to switch to a second ramp to a second predetermined voltage, the adjustable RC network 18a may adjust to output the second predetermined voltage. Adjustable RC network 18a may include resistance and capacitance in series. In one embodiment, charge pumps and regulating circuits 18 may hold the first predetermined voltage for a predetermined duration of time before ramping to the second predetermined voltage.

Returning to FIG. 10, data register 20 is capable of sensing data from the memory array 28, storing user input from the I/O buffer 12, and driving bit lines in the memory array 28. Data register 20 may store data immediately prior to programming or immediately after reading from the memory array 28. Data register 20 may include sense amplifiers and latches to sense and hold data.

The controller 16 sends address information corresponding to one or more memory cells of the memory array 28 to the address buffer 22 for programming and/or erasing of the memory cell(s). The address buffer 22 holds the addresses which are sent to the x-decoder 24 and y-decoder 26 to access the memory array 28. In response to a received address, the x-decoder 24 selects one or more rows of the memory array 28 for access. Similarly, upon receipt of an address, the y-decoder 26 selects one or more columns of the memory array 28 for access.

As shown in FIG. 10, memory device 10 is depicted as a NAND flash memory array, which is an erasable and programmable non-volatile memory. A NAND flash memory array includes memory cells serially connected between a drain selection transistor (SGD) and a source selection transistor (SGS), as shown above in FIG. 3. The memory array 28 includes memory cells organized in blocks, sectors, rows, and columns. Each memory cell may be individually read and programmed. Blocks of data may be accessed in pages by the data register 20 and temporarily stored in the data register 20.

Alternatively, memory device 10 may include non-volatile random access memory (NVRAM), ferroelectric random access memory (FeRAM or FRAM), ferromagnetic random access memory (FM-RAM), magnetoresistive random access memory (MRAM), phase-change memory (PCM), read-only memory (ROM), programmable read-only memory (PROM), erasable programmable read-only memory (EPROM), electrically erasable programmable read-only memory (EEPROM), flash memory (for example, flash NOR, flash EPROM), and other non-volatile memory. Further, memory device 10 may be formed and manufactured using MOS (metal oxide semiconductor) technology, CMOS (complementary MOS) technology, BiCMOS (bipolar CMOS) technology, or other semiconductor manufacturing technologies suitable for forming non-volatile memory.

It is appreciated that NAND memory programming method using double Vinhibit ramp for improved program disturb has been explained with reference to one or more exemplary embodiments, and that the claimed subject matter is not limited to the specific details given above. References in the specification made to other embodiments fall within the scope of the claimed subject matter.

Any reference to device may include a component, circuit, module, or any such mechanism in which the device can achieve the purpose or description as indicated by the modifier preceding the device. The component, circuit, module, or any such mechanism is, however, not necessarily a specific limitation to the device.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the claimed subject matter. The various appearances of "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Those skilled in the art having the benefit of this disclosure will appreciate that many other variations from the foregoing description and drawings may be made within the scope of the claimed subject matter. Indeed, the claimed subject matter is not limited to the details described above. Rather, it is the following claims including any amendments thereto that define such scope and variations.

What is claimed is:

1. A method for biasing an unselected word line of a memory array during programming, the method comprising:
applying an inhibit voltage Vinhibit to an unselected word line of the memory array, the inhibit voltage Vinhibit comprising a first portion and a second portion, the first portion of the inhibit voltage Vinhibit comprising an increase in voltage from a first predetermined voltage level to a second predetermined voltage level at a first predetermined voltage ramp rate, and the second portion of the inhibit voltage Vinhibit comprising an increase in voltage from the second predetermined voltage level to a third predetermined voltage level at a second predetermined voltage ramp rate, the second predetermined voltage ramp rate countering a voltage potential decay of the unselected word line caused by a leakage current.

2. The method of claim 1, wherein the first portion of the inhibit voltage Vinhibit is applied to the unselected word line until a boosted channel reaches a leakage-limited saturation potential.

3. The method of claim 1, further comprising holding the inhibit voltage Vinhibit at the first predetermined voltage for a predetermined duration of time before the second portion of the inhibit voltage Vinhibit is applied to the unselected word line.

4. The method of claim 3, wherein the predetermined duration of time that the inhibit voltage Vinhibit is held is greater than 0 microseconds to less than 5 microseconds.

5. The method of claim 1, wherein the first predetermined voltage is at or near Vinhibit where a boosted channel reaches a leakage-limited saturation potential.

6. The method of claim 1, wherein the first predetermined voltage is about 4 V to about 8 V.

7. The method of claim 1, wherein the second predetermined voltage is about 9 V to about 13 V.

8. A memory device, comprising:
a memory array of memory cells capable of being programmed, the memory cells being accessible using bit-lines and word lines, and
circuitry capable of applying an inhibit bias to word lines that are not selected for programming, wherein the circuitry is capable of
applying an inhibit bias to an unselected word line of the memory array, the inhibit bias comprising a first portion and a second portion, the first portion of the inhibit bias comprising an increase in voltage from a first predetermined voltage level to a second predetermined voltage level at a first predetermined voltage ramp rate, and the second portion of the inhibit bias comprising an increase in voltage from the second predetermined voltage level to a third predetermined voltage level at a second predetermined voltage ramp rate, the second predetermined voltage ramp rate countering a voltage potential decay of the unselected word line caused by a leakage current.

9. The memory device of claim 8, further comprising circuitry capable of detecting a condition to switch from the first portion of the inhibit bias to the second portion of the inhibit bias.

10. The memory device of claim 9, wherein the condition comprises the first portion of the inhibit bias reaching a leakage-limited saturation potential.

11. The memory device of claim 8, further comprising a channel region below one or more memory cells,
wherein the circuitry is preset based on one or more of: composition of substrate underneath the channel region, differences in processing, temperature, amount of leakage from the channel region.

12. The memory device of claim 8, further comprising circuitry capable of holding the first portion of the inhibit bias at the first predetermined voltage for a predetermined duration of time before applying the second portion of the inhibit bias to the unselected word line.

13. The memory device of claim 8, wherein the memory array is a NAND memory array.

14. A method for biasing an unselected word line during programming, the method comprising:
applying an inhibit bias to an unselected word line of the memory array, the inhibit bias comprising a first portion and a second portion, the first portion of the inhibit bias comprising an increase in voltage from a first predetermined voltage level to a second predetermined voltage level at a first predetermined voltage ramp rate, and the second portion of the inhibit bias comprising an increase in voltage from the second predetermined voltage level to a third predetermined voltage level at a second predetermined voltage ramp rate, the second predetermined voltage ramp rate countering a voltage potential decay of the unselected word line caused by a leakage current.

15. The method of claim 14, wherein the first portion of the inhibit bias is applied to the unselected word line until a boosted channel reaches a leakage-limited saturation potential.

16. The method of claim 14, further comprising holding the inhibit bias at the first predetermined voltage for a predetermined duration of time before the second portion of the inhibit bias is applied to the unselected word line.

* * * * *